(12) United States Patent
Edo et al.

(10) Patent No.: US 9,124,247 B2
(45) Date of Patent: Sep. 1, 2015

(54) SEMICONDUCTOR DEVICE INCLUDING A DECIMATION FILTER THAT PERFORMS PREDETERMINED FILTERING

(75) Inventors: Yusuke Edo, Kanagawa (JP); Seiji Kamada, Kanagawa (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 360 days.

(21) Appl. No.: 13/551,505

(22) Filed: Jul. 17, 2012

(65) Prior Publication Data
US 2013/0066934 A1 Mar. 14, 2013

(30) Foreign Application Priority Data

Sep. 8, 2011 (JP) .................. 2011-195708

(51) Int. Cl.
*H03H 17/06* (2006.01)
*H03M 3/00* (2006.01)

(52) U.S. Cl.
CPC .......... *H03H 17/0664* (2013.01); *H03M 3/456* (2013.01)

(58) Field of Classification Search
USPC .................................................. 708/300–323
See application file for complete search history.

(56) References Cited

U.S. PATENT DOCUMENTS

| | | | | |
|---|---|---|---|---|
| 4,954,828 A | * | 9/1990 | Orr | 342/20 |
| 5,157,395 A | * | 10/1992 | Del Signore et al. | 341/143 |
| 5,329,553 A | * | 7/1994 | Abbiate et al. | 375/247 |
| 5,463,569 A | * | 10/1995 | Staver et al. | 708/313 |
| 5,590,065 A | * | 12/1996 | Lin | 708/313 |
| 5,646,621 A | * | 7/1997 | Cabler et al. | 341/143 |
| 6,898,255 B2 | * | 5/2005 | Kim | 375/350 |
| 7,587,440 B2 | | 9/2009 | Aramaki | |

(Continued)

FOREIGN PATENT DOCUMENTS

| | | |
|---|---|---|
| JP | H05-299973 A | 11/1993 |
| JP | H07-183814 A | 7/1995 |
| JP | H 08-65165 A | 3/1996 |

(Continued)

OTHER PUBLICATIONS

Japanese Office Action dated Jun. 4, 2015 with English Translation.

*Primary Examiner* — Chuong D Ngo
*Assistant Examiner* — Calvin M Brien
(74) *Attorney, Agent, or Firm* — McGinn IP Law Group, PLLC

(57) ABSTRACT

To variably change the filter characteristic of a decimation filter in accordance with a sampling rate. A decimation filter 13 in a semiconductor device 1 sequentially inputs a signal sampled at a predetermined sampling rate $f_{os}$, and calculates, for each input signal that is input within a predetermined period (a period for M+2N), a filter coefficient Cj for performing predetermined filtering processing in response to a trigger signal TR continuously applied, and furthermore sequentially multiplies the input signal by the calculated filter coefficient, accumulates a multiplication value within the predetermined period, and sequentially outputs the result. The predetermined period is made variable in accordance with a time interval at which the trigger signal is applied.

17 Claims, 8 Drawing Sheets

(56) References Cited

U.S. PATENT DOCUMENTS

| | | |
|---|---|---|
| 8,712,709 B2 | 4/2014 | Abe |
| 2005/0246404 A1 | 11/2005 | Aramaki |
| 2008/0114821 A1* | 5/2008 | Masumoto .................... 708/313 |
| 2008/0211578 A1* | 9/2008 | Morishima ................... 330/251 |

FOREIGN PATENT DOCUMENTS

| | | |
|---|---|---|
| JP | 2005-318304 A | 11/2005 |
| JP | 2008-219560 A | 9/2008 |
| JP | 2009-207236 A | 9/2009 |
| JP | 2010-166268 A | 7/2010 |

* cited by examiner

SEMICONDUCTOR DEVICE INCLUDING A DECIMATION FILTER THAT PERFORMS PREDETERMINED FILTERING

CROSS-REFERENCE TO RELATED APPLICATION

The disclosure of Japanese Patent Application No. 2011-195708 filed on Sep. 8, 2011 including the specification, drawings and abstract is incorporated herein by reference in its entirety.

BACKGROUND

The present invention relates to a semiconductor device provided with a decimation filter that performs predetermined filtering processing on a signal sampled at a predetermined sampling rate, and converts this signal to a signal based on a required sampling rate to thereby output the resulting signal. More particularly, the present invention relates to a technique effectively applied to a decimation filter capable of changing the required sampling rate.

The decimation filter is a circuit including a function to down-sample a signal over-sampled by a clock signal having an extremely high frequency, and a low-pass filter (LPF) function to cut off an alias noise generated in downsampling. The decimation filter is applied to, for example, a delta sigma A/D converter.

Japanese Patent Laid-Open No. 5-299973 (Patent Document 1) and Japanese Patent Laid-Open No. 2005-318304 (Patent Document 2) each disclose the circuit configuration of a conventional decimation filter. Patent Document 1 discloses a decimation filter that is constituted by two blocks in order to perform filtering processing divided into two stages. Patent Document 2 discloses a decimation filter that is realized without using a multiplier.

Moreover, Japanese Patent Laid-Open No. 7-183814 (Patent Document 3), Japanese Patent Laid-Open No. 2009-207236 (Patent Document 4) and Japanese Patent Laid-Open No. 2008-219560 (Patent Document 5) each disclose a related art for making the characteristic of a filter variable. Patent Document 3 discloses a method of preparing three types of coefficient ROMs, in which a filter coefficient in a decimation filter is stored, and modifying a transfer function by switching the three-types of coefficient ROMs. Patent Document 4 discloses a method, in which the filter coefficient of a variable characteristic digital filter is made variable based on a motor operating current and a motor operating voltage or on the output value of the variable characteristic digital filter so as to obtain a filter characteristic optimum for detection of a ripple in a ripple detection device for a motor. Patent Document 5 discloses a method of changing a decimation ratio by changing the methods of reading a sample from a buffer memory temporarily storing a first signal (sample) sampled at a first sampling frequency.

SUMMARY

Conventionally, there have been a lot of products in which the sampling rate (sampling frequency) of downsampling by a decimation filter is set to a fixed value. Therefore, for example, when a system is constructed, in which a subsequent-stage microcomputer carries out a data processing through the use of data output from a decimation filter, a user needs to select a decimation filter that outputs data at a sampling rate with which the microcomputer can process.

Recently, there is a need for arbitrarily changing the sampling frequency of a decimation filter. When the sampling frequency of a decimation filter is made variable, a transfer function determining the filter characteristic of a low-pass filter needs to be adjusted accordingly. This is because when the transfer function of a decimation filter is fixed regardless of the sampling frequency, the cutoff frequency of the low-pass filter becomes fixed, and as a result, when the cutoff frequency becomes much higher than a frequency band (e.g., a frequency band in the vicinity of the sampling frequency) desired to be cut off, a sufficient cutoff effect cannot be obtained, or in contrast when the cutoff frequency becomes lower than the frequency of a signal desired to be obtained, there is a possibility that signal components even including a signal component desired to be obtained are cut off.

In contrast, a decimation filter needs to operate at a high speed with a clock signal corresponding to the sampling rate of an over-sampled signal, and thus in many cases the decimation filter is constituted by hardware. When a decimation filter is realized with hardware, it is not easy to make a transfer function determining the filter characteristic variable. As with the method of Patent Document 3 described above, the transfer function can be made variable by selectively using a plurality of coefficient ROMs that are incorporated in advance, but since the number of coefficient ROMs to be selected is limited, the types of sampling frequencies a user can set are limited. Moreover, Patent Document 4 described above shows a method of making the filter coefficient variable based on a motor operating current or the like, but it does not describe a specific control method, such as how to use the motor operating current or the like and how to make the filter coefficient variable.

Furthermore, in a decimation filter, in order to remove an aliasing noise, notch (stop band) characteristic may be provided in accordance with a specific frequency. For example, in order to cut off an aliasing noise which is generated because a signal in the vicinity of the sampling frequency of a decimation filter is folded back to the lower frequency side centered around a frequency that is a half the sampling frequency, frequency (hereinafter, referred to also as the notch frequency) defining a frequency band in which the notch characteristic is provided is set in accordance with the sampling frequency. As a specific example of the notch characteristic of a decimation filter, FIG. 7 illustrates the frequency characteristic of a decimation filter, the transfer function of which is fixed, applied to a delta sigma A/D converter. The delta sigma A/D converter applying the decimation filter of the frequency characteristic shown in the figure over-samples an analog signal in the vicinity of, for example, 60 Hz at 3 MHz, and converts this to a digital signal of a sampling rate (sampling frequency) of approximately 12.2 kHz to output this digital signal. The signal in the vicinity of the sampling frequency (12.2 kHz) generates an aliasing noise based on the frequency of a half the sampling frequency (12.2 kHz). Since the aliasing noise is generated in the vicinity of the frequency (60 Hz) of an analog signal targeted for A/D conversion, there is a possibility that the aliasing noise affects the result of the A/D conversion. Therefore, as shown in the figure, a notch frequency ($\approx$12.2 kHz) is set in accordance with the sampling frequency, and the signal in the vicinity of the sampling frequency is cut off. Because of this, the aliasing noise based on the signal in the vicinity of the sampling frequency can be reduced.

Thus, when the decimation filter has notch characteristic, the notch frequency is set in accordance with a sampling frequency, and thus if the sampling frequency is varied in a state in which the notch frequency is fixed, the frequency band of a signal desired to be removed and the notch frequency shift from each other, and there is a possibility that a desired signal can not be removed. As a specific example of the notch characteristic when the sampling frequency is changed with the notch frequency of a decimation filter fixed, FIG. 8 illustrates another frequency characteristic of a decimation filter with the transfer function fixed. FIG. 8 shows the frequency characteristic when the notch frequency is set to 12.2 kHz as with FIG. 7 and the sampling frequency is changed from 12.2 kHz to approximately 8.93 kHz. In this case, because the notch frequency is 12.2 kHz, signals in the vicinity of the sampling frequency (8.93 kHz) are not removed and an aliasing noise is generated in the frequency band of the analog signal. Because of this, for example, when the output signal of the decimation filter is re-sampled by a subsequent-stage signal processing circuit, there is a possibility that the accuracy of the re-sampled signal degrades. In Patent Document 5 described above, neither the cutoff frequency nor the notch frequency is referred to, and a specific method of changing these frequencies is not shown. It should be noted that, as a method of making the cutoff frequency and the notch frequency flexibly variable, there is also a method of realizing the decimation filter by using a DSP (Digital Signal Processor), but in this case the circuit size dramatically increases, which is not realistic.

The present invention has been made in view of the above circumstances and provides a technique capable of making the filter characteristic of a decimation filter variable in accordance with the sampling rate of a decimation filter.

The other purposes and the new feature of the present invention will become clear from the description of the present specification and the accompanying drawings.

The following explains briefly the outline of a typical invention among the inventions disclosed in the present application.

That is, a decimation filter in a semiconductor device sequentially inputs a signal sampled at a predetermined sampling rate, and calculates, for each input signal that is input within a predetermined period, a filter coefficient for performing predetermined filtering processing in response to a continuously applied trigger signal, and furthermore sequentially multiplies the input signal by the calculated filter coefficient, accumulates a multiplication value within the predetermined period, and sequentially outputs the result. The predetermined period is made variable in accordance with a time interval at which the trigger signal is applied.

The following explains briefly the effect obtained by the typical invention among the inventions disclosed in the present application.

That is, according to the semiconductor device, the filter characteristic of a decimation filter can be varied in accordance with a sampling rate.

DETAILED DESCRIPTION

1. Overview of an Embodiment

Figure 1:
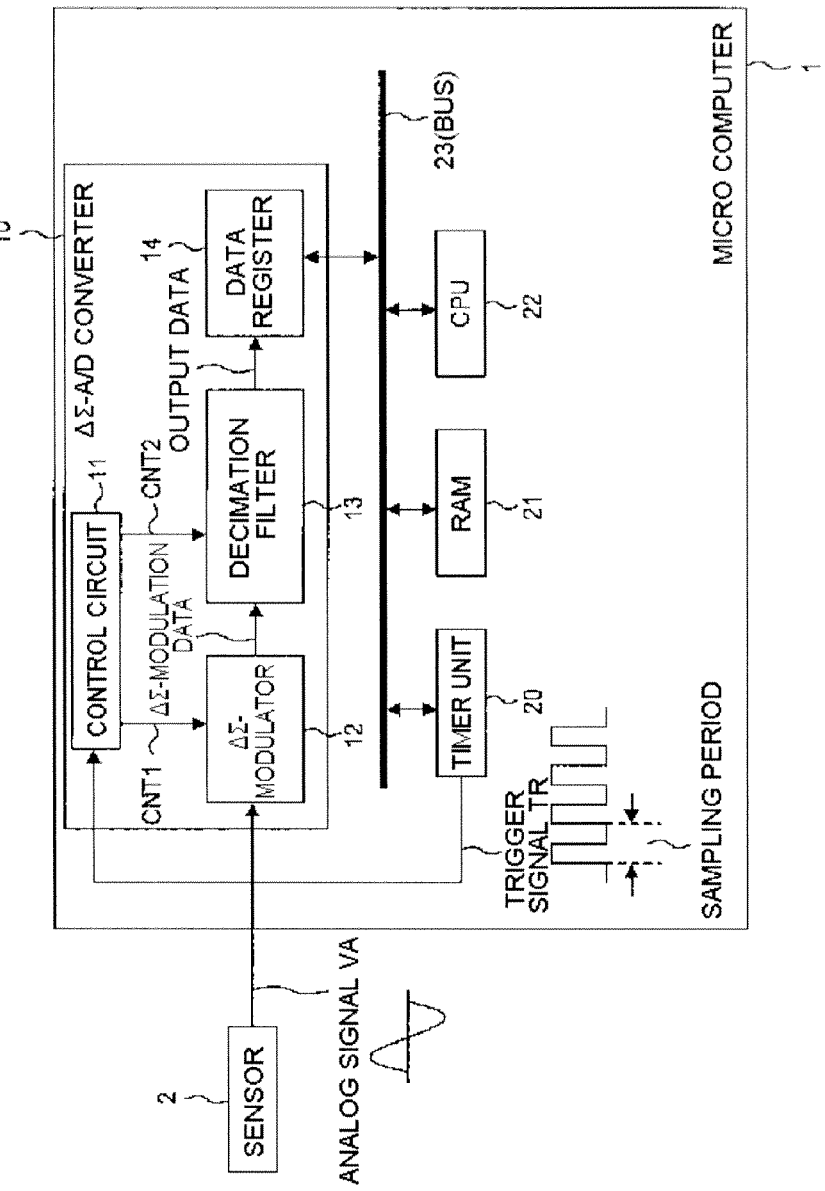
FIG. 1 is a block diagram showing an example of a microcomputer with a delta sigma A/D converter having a decimation filter as an element.

First, the overview of a typical embodiment of the invention disclosed in the present application will be described. In the overview description of the typical embodiment, a reference numeral referred to with parentheses in the drawings simply illustrates what is included in the concept of an element with the reference numeral attached thereto.

[1] (Decimation Filter Changing the Calculation Period of Filtering Processing in Response to a Trigger Cycle)

A semiconductor device (1) according to a typical embodiment of the present invention is a semiconductor device including a decimation filter (13) that sequentially inputs a signal (one bit to a plurality of bits of digital signal related to ΔΣ-modulation data) sampled at a predetermined sampling rate ($f_{os}$) and performs predetermined filtering processing on an input signal and furthermore converts this to a signal based on a required sampling rate to output the resulting signal. The decimation filter, in response to a continuously applied trigger signal (TR), calculates a filter coefficient (CA (CB)) for performing predetermined filtering processing on the each input signal that is input within a predetermined period (period of M+2N cycles), sequentially multiplies the input signal by the calculated filter coefficient, and furthermore accumulates a multiplication value within the predetermined period and sequentially outputs the resulting value. The predetermined period is made variable in accordance with a time interval at which the trigger signal is applied.

According to this, for example, by applying the trigger signal to the decimation filter with a cycle based on the required sampling rate, a period for calculating the filter coefficient and a period for accumulating the multiplication value vary in accordance with the required sampling rate. Because of this, a transfer function can be modified, and thus the filter characteristic of a decimation filter can be varied in accordance with the sampling rate of the decimation filter.

[2] (Decimation Filter, the Transfer Function of which Varies in Response to Two-Time Trigger Applications)

In the semiconductor device of the item [1], the decimation filter includes: a coefficient calculation unit (139_A (139_B)) which, in response to the trigger signal, sequentially calculates the filter coefficient every time the input signal is input, and an arithmetic unit (137_A (137_B) and 138_A (138_B)) which, every time the input signal is input, multiplies the input signal by the filter coefficient calculated by the coefficient calculation unit, and accumulates this multiplication value to output the resulting value. The coefficient calculation unit, in a first period (401, 401_A, 401_B) after the trigger signal is applied, sequentially calculates the filter coefficient so that a value increases in accordance with the number of times when the input signal is input after the trigger signal is applied, while in a second period (403, 403_A, 403_B) after the trigger signal is applied, the coefficient calculation unit sequentially calculates the filter coefficient so that the value decreases in accordance with the number of times when the input signal is input after the trigger signal is applied. Moreover, the arithmetic unit sequentially outputs a value obtained by accumulating the multiplication value from the time when the first period is started to the time when the second period ends. Each of the first period and the second period is a predetermined period (M≥2N) that is shorter than a cycle corresponding to the required sampling rate and is a predetermined period (2N).

The coefficient calculation unit in the semiconductor device of the item [2] sets each of the first period and the second period to a predetermined period that is shorter than a cycle corresponding to the required sampling rate, and calculates the filter coefficient by the above-described method in the first period and the second period. Therefore, the decimation filter according to the item [2] can have basic filter characteristic as a low-pass filter. Furthermore, by starting to calculate a filter coefficient in the second period upon application of the next trigger signal after calculating the filter coefficient in the first period, the longer a cycle in which the trigger signal is applied becomes, the longer a period during which the coefficient calculation unit calculates the filter coefficient and a period during which the arithmetic unit accumulates the multiplication value become. That is, through the use of the decimation filter according to the item [2], the filter characteristic of a low-pass filter can be finely adjusted in accordance with the length of a period from the time when the first period ends to the time when the second period is started, while maintaining the basic filter characteristic as a low-pass filter.

[3] (Calculation of a Filter Coefficient as a Fixed Value)

In the semiconductor device of the item [2], the coefficient calculation unit, in a third period (402, 402_A, 402_B) until the next trigger signal is applied after the first period elapses, calculates the filter coefficient serving as a fixed value ($N^2$).

Also in the third period, the calculation based on a filter coefficient is carried out and the sampling period is extended, and as a result, an oversampling ratio improves, and thus due to an increase in the third period, the improvement in conversion accuracy can be also expected.

[4] (Subtraction of a Pre-M-Cycles Filter Coefficient)

In the semiconductor device of the item [3], the coefficient calculation unit, in the second period, calculates the filter coefficient by sequentially subtracting a value of the filter coefficient calculated in the previous first period from a value of the filter coefficient calculated in the third period, every time the input signal is input.

According to this, a notch characteristic can be given at a frequency corresponding to a cycle in which the trigger signal is applied. Thus, the notch frequency can be varied with a change in the sampling rate, and thus the aliasing noise caused by the signal of a frequency band based on the sampling rate can be suppressed.

[5] (Counter)

In the semiconductor device of the item [3] or [4], the decimation filter further includes a counter unit (134) which, in response to the trigger signal, counts a clock signal (a clock signal of an over-sampling frequency $f_{os}$) that is generated in response to a timing at which the input signal is input. The counter unit starts a count operation for counting the clock signal when the trigger signal is applied, and the counter unit interrupts the count operation when a count value by the count operation coincides with a first value (2N), resumes the count operation when the next trigger signal is input, and stops the count operation when the count value coincides with a second value (4N) larger than the first value. The coefficient calculation unit sets a period after the trigger signal is applied until the count value coincides with the first value, to the first period, sets a period during which the count operation is interrupted to the third period, and sets a period after the next trigger signal is applied until the count value coincides with the second value to the second period, and calculates the filter coefficient, with the count value as the number of times of input.

According to this, calculations of the filter coefficient in the first period, in the second period, and in the third period, respectively, can be easily controlled. In particular, in the second period, by utilizing the fact that the count value does not vary while the count operation is interrupted, the filter coefficient to serve as a fixed value can be easily calculated.

[6] (Decimation Filter, in which Two Filter Processing Sections Complementarily Operate in Response to a Trigger Signal)

In the semiconductor device of any one of the items [2] to [5], the decimation filter further includes: two sets of filter processing sections (132_A, 132_B), each being one set of the coefficient calculation unit and the arithmetic unit, and a selection unit (133) that inputs signals output from the arithmetic units in the filter processing section, respectively, and selects either one of the signals and outputs this signal as an output signal of the decimation filter. The respective filter processing sections complementarily operate in response to application of the trigger signal. Moreover, the selection unit alternately selects the signals output from the respective arithmetic units, and outputs the signal at a time interval based on the cycle in which the trigger signal is applied.

According to this, the values accumulated by the respective arithmetic units are alternately output at a time interval based on the cycle in which the trigger signal is applied. That is, if the trigger signal is applied in a cycle corresponding to a desired sampling rate, the output signal of the decimation filter can be output at the desired sampling rate.

[7] (Semiconductor Device Including a ΔΣ-AD Converter and a CPU (Microcomputer))

A semiconductor device (1) according to another typical embodiment of the present invention includes: an analog-to-digital converter (10) which, based on a delta-sigma modulation scheme, converts an input analog signal (VA) to a digital signal based on a required sampling rate to output this digital signal; a central processing unit (22) that carries out a data processing based on the digital signal converted by the analog-to-digital converter: and a timer unit (20) that outputs the trigger signal (TR) in a cycle corresponding to the required sampling rate. The analog-to-digital converter includes: a delta-sigma modulator (12) that over-samples the analog signal at a predetermined sampling rate ($f_{os}$) and carries out a delta sigma modulation: and a decimation filter (13) sequentially receiving the signal delta-sigma modulated by the delta-sigma modulator and performing predetermined filtering processing on an input signal, and furthermore converting the resulting signal to a digital signal based on a required sampling rate and outputting the digital signal. The decimation filter, in response to the trigger signal continuously output from the timer unit, calculates a filter coefficient (CA (CB)) for performing predetermined filtering processing on the each input signal that is input within a predetermined period (period of M+2N cycles) sequentially multiplies the input signal by the calculated filter coefficient, and furthermore accumulates a multiplication value within the predetermined period and sequentially outputs the resulting value. The predetermined period is made variable in accordance with a time interval in which the trigger signal is output.

According to this, because the timer unit outputs the trigger signal in a cycle based on the required sampling rate, a period for calculating the filter coefficient and a period for accumulating the multiplication value vary in accordance with the required sampling rate. Thus, as with the item [1], the filter characteristic of the decimation filter can be varied in accordance with the sampling rate of the decimation filter.

[8] (Decimation Filter, the Transfer Function of which Varied in Response to Two-Time Trigger Applications)

In the semiconductor device of the item [7], the decimation filter includes: a coefficient calculation unit (139_A (139_B)) which, in response to the trigger signal, sequentially calculates the filter coefficient every time the input signal is input, and an arithmetic unit (137_A (137_B) and 138_A (138_B)) which, every time the input signal is input, multiplies the input signal by the filter coefficient calculated by the coefficient calculation unit, and accumulates this multiplication value to output the resulting value. The coefficient calculation unit, in the first period (401, 401_A, 401_B) after the trigger signal is applied, sequentially calculates the filter coefficient so that a value increases in accordance with the number of times when the input signal is input after the trigger signal is applied, while in the second period (403, 403_A, 403_B) after the trigger signal is applied, the coefficient calculation unit sequentially calculates the filter coefficient so that the value decreases in accordance with the number of times when the input signal is input after the trigger signal is applied. Moreover, the arithmetic unit sequentially outputs a value obtained by accumulating the multiplication values after the first period is started until the second period ends. The first period and the second period each are a predetermined period that is shorter than a cycle corresponding to the required sampling rate (M≥2N) and is a predetermined period (2N).

According to this, as with the item [2], the filter characteristic of a low-pass filter can be finely adjusted in accordance with the length of a period after the first period ends until the second period is started, while having the basic filter characteristic as the low-pass filter.

[9] (Calculation of a Filter Coefficient as a Fixed Value)

In the semiconductor device of the item [8], the coefficient calculation unit, in the third period (402, 402_A, 402_B) until the next trigger signal is output after the first period elapses, calculates the filter coefficient to serve as a fixed value ($N^2$).

Also in the third period, the calculation based on a filter coefficient is carried out and the sampling period is extended, and as a result an oversampling ratio will improve, and thus due to an increase in the third period, an improvement in conversion accuracy can be also expected.

[10] (Subtraction of a Pre-M-Cycles Filter Coefficient)

In the semiconductor device of the item [9], the coefficient calculation unit, in the second period, calculates the filter coefficient by sequentially subtracting a value of the filter coefficient calculated in the previous first period from a value of the filter coefficient calculated in the third period, every time the input signal is input.

According to this, as with the item [4], the notch frequency can be varied with a change in the sampling rate, and thus the aliasing noise caused by the signal of a frequency band based on the sampling rate can be suppressed.

[11] (Counter)

In the semiconductor device of the item [9] or [10], the decimation filter further includes a counter unit (134) which, in response to the trigger signal, counts a clock signal (a clock signal of the over-sampling frequency $f_{os}$) that is generated in response to a timing at which the input signal is input. The counter unit starts a count operation for counting the clock signal when the trigger signal is output, and the counter unit interrupts the count operation when a count value obtained by the count operation coincides with a first value (2N), and resumes the count operation when the next trigger signal is input, and stops the count operation when the count value coincides with a second value (4N) larger than the first value. The coefficient calculation unit sets a period after the trigger signal is output until the count value coincides with the first value to the first period, sets a period during which the count operation is interrupted to the third period, sets a period after the next trigger signal is output until the count value coincides with the second value to the second period, and calculates the filter coefficient, with the count value as the number of times of input.

According to this, as with the item [5], the calculation of the filter coefficient in the respective periods can be easily controlled. In particular, in the second period, by utilizing the fact that the count value does not vary while the count operation is interrupted, the filter coefficient to serve as a fixed value can be easily calculated.

[12] (Decimation Filter in which Two Filter Processing Sections Complementarily Operate in Response to a Trigger Signal)

In any one of the semiconductor devices of the items [8] to [11], the decimation filter further includes two sets of filter processing sections (132_A, 132_B), each being one set of the coefficient calculation unit and the arithmetic unit, and a selection unit (133) that inputs signals output from the arithmetic units in the filter processing section, respectively, and selects and outputs either one of the signals as an output signal of the decimation filter. The respective filter processing sections complementarily operate in response to output of the trigger signal. The selection unit, at a time interval based on the cycle in which the trigger signal is output, alternately selects the signals output from the respective arithmetic units, to output the signal.

According to this, as with the item [6], the output signal of the decimation filter can be output at the desired sampling rate.

2. Details of the Embodiment

The embodiment will be described further in detail.

Embodiment

FIG. 1 is a block diagram showing an example of a microcomputer with a delta sigma A/D converter having a decimation filter as an element, as one embodiment of the present invention. A microcomputer 1 shown in the figure is formed in a semiconductor substrate of single crystal silicon or the like through the use of the well-known technology for producing a CMOS integrated circuit although not limited in particular. The microcomputer 1 is, for example, a microcomputer for an electric-power meter, and inputs an analog signal VA with 50 Hz to 60 Hz output from a sensor 2 for detecting an electric energy, converts this signal into a digital signal, and carries out various data processing based on the converted digital signal.

The microcomputer 1 includes, for example, a ΔΣ (delta sigma)-analog-to-digital converter (ΔΣ-A/D converter) 10, a CPU 22, a memory (RAM) 21, a timer unit 20, a bus 23, other non-illustrated I/O interface circuit, and the like. The respective functional units are coupled in common via the bus 23. The CPU 22 performs overall control on each functional unit of the ΔΣ-analog-to-digital converter 10, the timer unit 20, and the like in accordance with a program stored in a non-illustrated nonvolatile memory, and also executes various data processing based on the data in a digital format converted by the ΔΣ-analog-to-digital converter 10. The memory 21 is a storage unit for storing a calculation result and the like related to the data processing by the CPU 22, and is, for example, a RAM (Random Access Memory).

The timer unit 20 is a timer circuit that generates various pulse signals in accordance with a set pulse generation condition. In FIG. 1, as a typical example of the various pulse signals generated, a trigger signal TR is illustrated. The trigger signal TR is a signal for determining a sampling frequency (sampling rate) of the ΔΣ-analog-to-digital converter 10, and is applied to the ΔΣ-analog-to-digital converter 10. Although the detail will be described later, the sampling frequency of the ΔΣ-analog-to-digital converter 10 is made variable depending on a time interval (cycle) of the trigger signal TR. The time interval at which the trigger signal TR is output, i.e., the frequency of the trigger signal TR, can be arbitrarily set by a user, and for example, the frequency of an integral multiple of the oversampling frequency $f_{os}$ (to be described later) of the ΔΣ-analog-to-digital converter 10 is set.

The ΔΣ-analog-to-digital converter 10 inputs and over-samples the analog signal VA output from the sensor 2, and converts this to a digital signal corresponding to a required sampling frequency (sampling rate) lower than a frequency at which the analog signal VA is over-sampled, to output this digital signal. As stated above, the sampling frequency is made variable by the cycle of the trigger signal TR continuously output from the timer unit 20. For example, the ΔΣ-analog-to-digital converter 10 over-samples an analog signal in the vicinity of 50 Hz to 60 Hz with a frequency of 3 MHz, and down-samples the resulting signal to a digital signal of a sampling frequency that is determined based on the cycle of the trigger signal TR, to output this digital signal. It should be noted that, to what extent value the sampling frequency is set may be determined in consideration of the frequency band of the analog signal VA output from the sensor 2, the frequency band that can be processed by a functional unit (e.g., CPU 22 in FIG. 1) executing various data processing through the use of an A/D conversion result by the ΔΣ-analog-to-digital converter 10, or the like.

Specifically, the ΔΣ-analog-to-digital converter 10 includes a control circuit 11, a ΔΣ-modulator 12, the decimation filter 13, and a data register 14. The control circuit 11 controls the ΔΣ-modulator 12, the decimation filter 13, and the data register 14. For example, the control circuit 11 generates a control signal CNT1 in response to application of the trigger signal TR, and controls the execution and stoppage of the processing performed by the ΔΣ-modulator 12. Moreover, the control circuit 11 generates a control signal CNT2 in response to application of the trigger signal TR, and controls a counter unit 134 provided in the decimation filter 13 to be described later or controls the input/output of data.

The ΔΣ-modulator 12 over-samples the analog signal VA with an oversampling frequency $f_{os}$ higher than the sampling frequency of the ΔΣ-analog-to-digital converter 10. The oversampling is carried out by sampling the analog signal VA in synchronization with the clock signal of the oversampling frequency $f_{os}$ generated by a non-illustrated clock generation circuit. Then, the ΔΣ-modulator 12 modulates the data obtained by oversampling so as to become a pulse sequence with a density proportional to the amplitude of the analog signal VA by using the ΔΣ-modulation scheme, and outputs the pulse sequence. Hereinafter, the digital signal output from the ΔΣ-modulator 12 is referred to as ΔΣ-modulation data.

The decimation filter 13 inputs the ΔΣ-modulation data output from the ΔΣ-modulator 12 and performs predetermined filtering processing on this input signal, and also down-samples the resulting input signal to a digital signal based on a required sampling rate (sampling frequency) to output this digital signal. Specifically, the decimation filter 13 samples by sequentially inputting one bit to a plurality of bits of digital data constituting the ΔΣ-modulation data, performs predetermined filtering processing based on the data sampled in a predetermined period, and sequentially outputs a processing result (output data) for the each predetermined period. The output data output from the decimation filter 13 is stored in the data register 14.

It should be noted that, in the description below, the unit to sample one bit digital signal of the ΔΣ-modulation data in synchronization with the clock signal of the frequency $f_{os}$ is referred to as one cycle.

As described above, because the sampling frequency of the ΔΣ-analog-to-digital converter 10 varies in accordance with the cycle of the trigger signal TR continuously output, the filter characteristic of the decimation filter 13 also needs to be adjusted in accordance with the cycle of the trigger signal TR. Therefore, the decimation filter 13 is configured so that a calculation period, during which one-time filtering processing is performed, is determined by two-time applications of the trigger signal TR.

Figure 2:
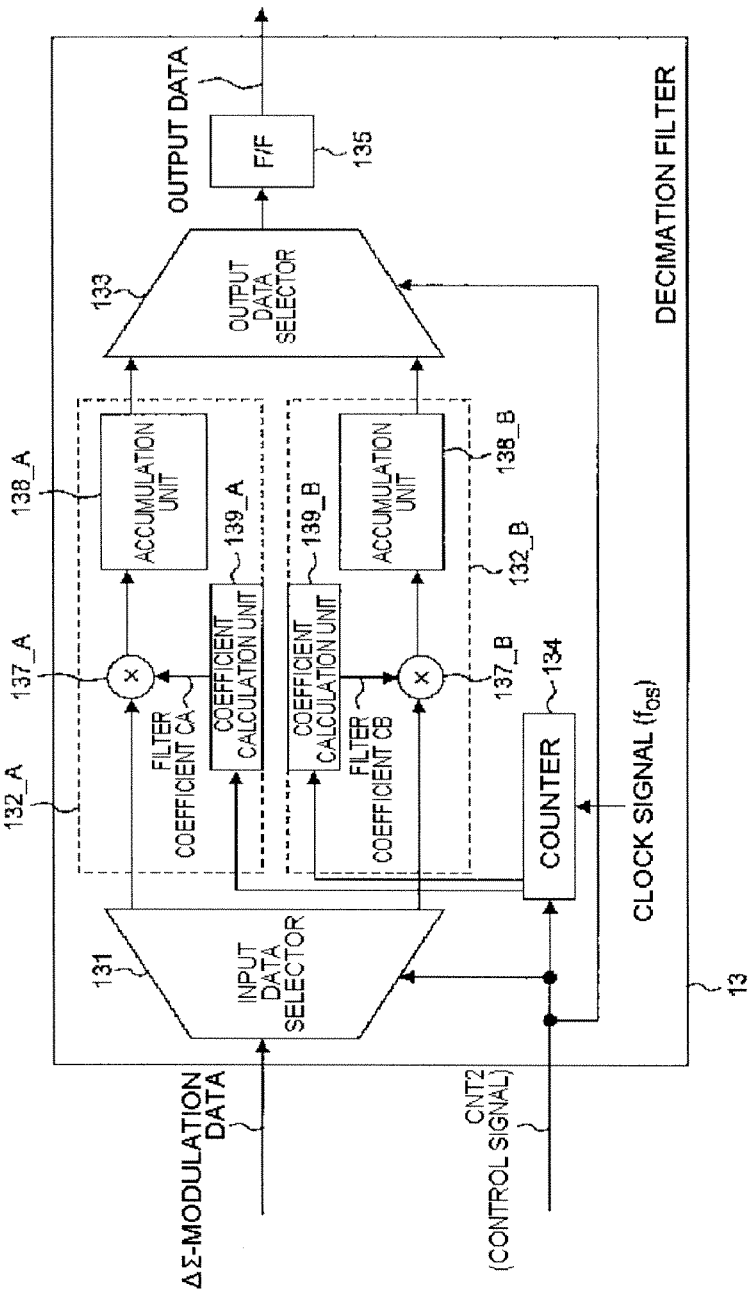
FIG. 2 is a block diagram showing an example of the circuit configuration of a decimation filter 13.

FIG. 2 illustrates the circuit configuration of the decimation filter 13. As shown in the figure, the decimation filter 13 includes two processing sections. Specifically, the decimation filter 13 includes an input data selector 131, a first filter processing section 132_A, a second filter processing section 132_B, an output data selector 133, the counter unit 134, and a flip-flop circuit (F/F) 135.

The input data selector 131, based on the control signal CNT2, allocates the input ΔΣ-modulation data between the first filter processing section 132_A and the second filter processing section 132_B.

The counter unit 134 counts the clock signal of the over-sampling frequency $f_{os}$ generated by the clock generation circuit, and outputs this count value to the first filter processing section 132_A and the second filter processing section 132_B. The counter unit 134 includes, for example, a counter circuit for the first filter processing section 132_A and a counter circuit for the second filter processing section 132_B, and the respective counter circuits alternately carry out a count operation in response to the trigger signal TR. It should be noted that the counter circuit for the first filter processing section 132_A and the counter circuit for the second filter processing section 132_B each have the same circuit configuration, and thus in the following description, the operation thereof will be described simply as a counter circuit without particularly distinguishing them.

When the trigger signal TR is output and the ΔΣ-modulator 12 starts to output the ΔΣ-modulation data, the counter circuit will start the count operation for counting the clock signal. Then, when the count value has reached the first value (2N), the count operation is interrupted and this value is held. Thereafter, when the next trigger signal TR is applied, the count operation is started again. Then, when the count value has reached the second value (4N), the count operation is stopped and the count value is reset. The above operation is repeated every time the trigger signal TR is applied. The above-described count operation by the counter unit 134 is controlled by the control signal CNT2 which the control circuit 11 generates based on the trigger signal TR.

The first filter processing section 132_A and the second filter processing section 132_B (when generally referred to, these sections are simply referred to as a filter processing section 132) perform filtering processing according to a predetermined transfer function on the ΔΣ-modulation data that is input via the input data selector 131. Specifically, the filter processing section 132 sequentially inputs one-bit digital signal constituting the ΔΣ-modulation data, calculates the filter coefficient $C_j$ for performing filtering processing on each one-bit digital signal that is input within a predetermined period, sequentially multiplies the one-bit digital signal by the calculated filter coefficient $C_j$, and accumulates a multiplication value within the predetermined period and sequentially outputs the resulting value. The predetermined period is determined by the cycle of the trigger signal TR continuously applied. It should be noted that, in the description below, the filter coefficient calculated by the first filter processing section 132_A is represented by CA and the filter coefficient calculated by the second filter processing section 132_B is represented by CB, and when generally referred to, these filter coefficients are represented by a filter coefficient $C_j$ as described above. The detail of the filter processing section 132 will be described later.

The output data selector 133 inputs the data accumulated by the first filter processing section 132_A and the data accumulated by the second filter processing section 132_B, and alternately selects and outputs these input data. For example, the output data selector 133 alternately selects and outputs data for each cycle of the trigger signal TR. The selection operation by the output data selector 133 is controlled by the control signal CNT2 which the control circuit 11 generates based on the trigger signal TR.

The flip-flop circuit 135 holds the output data sequentially output from the output data selector 133. The held output data is sequentially stored in the data register 14.

Here, the filter processing section 132 will be described in detail.

The transfer function of the decimation filter 13, i.e., the transfer function of the filter processing section 132, is expressed by Formula 1, for example.

$$H(z) = z^{-1} \cdot \left[\frac{1-z^{-M}}{1-z^{-1}}\right] \cdot \left[\frac{1-z^{-N}}{1-z^{-1}}\right] = \sum_{j=1}^{M+2N-2} C_j z^{-j} \quad \text{Formula 1}$$

In the formula, M and N are parameters expressing the number of cycles of oversampling (an integer no less than 0), and $C_j$ is the filter coefficient. Here, $C_j$ is expressed by Formula 2 to Formula 6 below.

$C_j = j + C_{j-1} (j=1 \text{ to } N-1)$ \hfill Formula 2

$C_j = N_{-j} + C_{j-1} (j=N \text{ to } 2N-1)$ \hfill Formula 3

$C_j = N^2 (j=2N \text{ to } M-1)$ \hfill Formula 4

$C_j = -j + C_{j-1} (j=M \text{ to } M+N-1)$ \hfill Formula 5

$C_j = -N+j + C_{j-1} (j=M+N \text{ to } M+2N-1)$ \hfill Formula 6

In a conventional decimation filter, when the filter characteristic determined by the transfer function of Formula 1 is obtained, the parameters M and N are fixed values determined by the system. In the decimation filter 13, in order to make the transfer function of a filter variable based on the cycle of the trigger signal TR, the parameter M is caused to correspond to the cycle ($M/f_{os}$) of the trigger signal TR and the value of the parameter M is varied with a change in the cycle of the trigger signal TR. The parameter N is a fixed value that is determined in advance, and is 2N=256, for example. The relationship between the parameters M and N is M≥2N, for example.

Here, when the term expressed by Formula 7 in Formula 1 is expanded, Formula 8 is obtained. In Formula 8, for a coefficient Cx of each term, Cx=0, 1, 2, 3, . . . N−1, N, N−1, . . . 2, 1, 0.

$$z^{-1} \cdot \left[\frac{1-z^{-N}}{1-z^{-1}}\right]^2 \quad \text{Formula 7}$$

$$z^{-1} + 2z^{-2} + 3z^{-3} + \ldots + (N-1)z^{-(N-1)} + Nz^{-N} + (N-1)z^{-(N+1)} + \ldots + 2z^{-(2n-2)} + z^{-(2N-1)} \quad \text{Formula 8}$$

Moreover, in other terms excluding Formula 7 in Formula 1, "$1/(1-z^{-1})$" implies an integration circuit (low-pass filter), "$1-z^{-M}$" implies that from the value of a sample at a certain time point, an pre-M-samples (pre-M-cycles) value is subtracted. From this, it is understood that the transfer function expressed by Formula 1 can be realized by a circuit. Specifically, the filter processing section 132 sequentially calculates the filter coefficient $C_j$ for each one cycle, multiplies a digital signal related to the input ΔΣ-modulation data by the filter coefficient C, and sequentially accumulates this multiplication value, thereby realizing the filter characteristic of the transfer function of Formula 1.

A notch characteristic determined by the transfer function of Formula 1 will be described. The value of the transfer function H(z) becomes "0 (zero)" at a notch frequency determining the notch characteristic. That is, focusing attention on the numerator of Formula 1, the transfer unction H(z)=0 at $z^{-N}=1$ or $z^{-M}=1$. Here, because $z^{-N}$ is expressed by Formula 9 and $z^{-M}$ is expressed by Formula 10, notch frequencies fn1 and fn2 at which the transfer function H(z)=0 are expressed by Formula 11 and Formula 12. It should be noted that n is an integer no less than 1.

$$z^{-N} = \exp\left[-j \cdot 2\pi \frac{Nf}{f_{os}}\right] \quad \text{Formula 9}$$

$$z^{-M} = \exp\left[-j \cdot 2\pi \frac{Mf}{f_{os}}\right] \quad \text{Formula 10}$$

$$f_1 = \frac{f_{os}}{N} n \quad \text{Formula 11}$$

$$f_2 = \frac{f_{os}}{M} n \quad \text{Formula 12}$$

As shown in Formula 11 and Formula 12, the filter processing section 132 has a notch filter characteristic at a frequency $f_1$ determined based on the parameter N and a frequency $f_2$ determined based on the parameter M. As described above, because the parameter N is a fixed value, the notch frequency $f_1$ is a fixed value, but because the parameter M varies in accordance with the cycle of the trigger signal TR, the notch frequency $f_2$ also varies. Moreover, because the cycle of the trigger signal TR is expressed by $M/f_{os}$, the sampling frequency is $f_{os}/M$ and coincides with the value of the notch frequency $f_2$ when n=1. That is, by determining the sampling frequency corresponding to the cycle of the trigger signal TR, the notch frequency can be varied with a change in the sampling frequency and the aliasing noise caused by the signal of a frequency band based on the sampling frequency (sampling rate) can be suppressed.

Next, the cutoff frequency fc of the low-pass filter determined by the transfer function of Formula 1 will be described.

The cutoff frequency fc of the low-pass filter is affected by the parameter M. Specifically, because the amplitude characteristic of the filter is attenuated as approaching the notch frequency, the cutoff frequency fc can be reduced as the notch frequency is lowered by increasing the cycle (parameter M)

of the trigger signal TR. Thus, it is understood that the cutoff frequency fc will vary with a change in the cycle of the trigger signal TR.

A specific circuit configuration of the filter processing section 132 for realizing the above-described transfer function will be described.

Here, the first filter processing section 132_A will be described as a representative, because the first filter processing section 132_A and the second filter processing section 132_B are constituted by the same circuit block.

The first filter processing section 132_A includes a multiplication unit 137_A and an accumulation unit 138_A as the arithmetic unit, and a coefficient calculation unit 139_A. The coefficient calculation unit 139_A calculates the filter coefficient CA determining the transfer function of the decimation filter 13. Specifically, the coefficient calculation unit 139_A, in response to the trigger signal TR, sequentially calculates the filter coefficient CA every time the one-bit digital signal of the ΔΣ-modulation data is input. For example, when the trigger signal TR is output and the output of the ΔΣ-modulation data in synchronization with the clock signal is started, the filter coefficient CA is sequentially calculated in synchronization with the clock signal by carrying out a predetermined calculation using the count value obtained from the counter unit 134.

A method of calculating the filter coefficient CA by the coefficient calculation unit 139_A will be described in detail.

Figure 3:
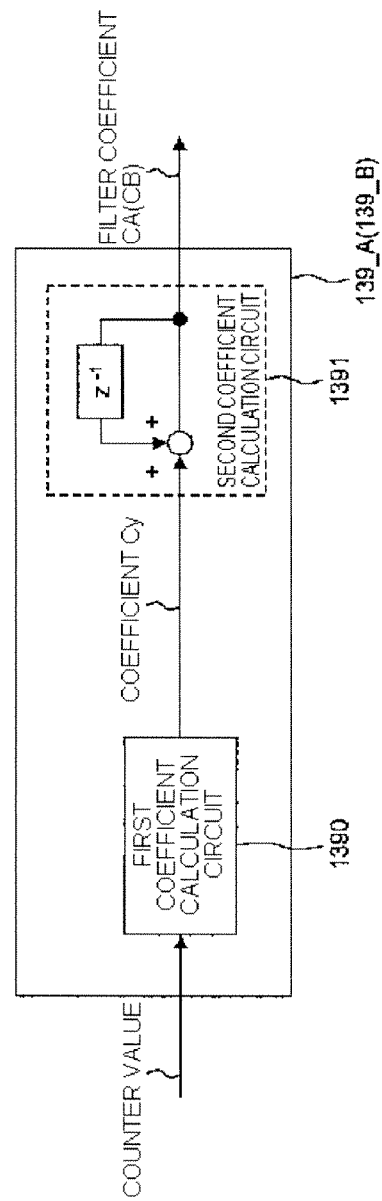
FIG. 3 is a block diagram showing an example of the internal configuration of a coefficient calculation unit 139_A (139_B)

FIG. 3 is a block diagram showing an example of the internal configuration of the coefficient calculation unit 139_A. The coefficient calculation unit 139_A includes a first coefficient calculation circuit 1390 and a second coefficient calculation circuit 1391. The first coefficient calculation circuit 1390 calculates the coefficient Cx based on the count value from the counter unit 134, and calculates a coefficient Cy based on the coefficient Cx. As described above, the coefficient Cx is the coefficient of each term in Formula 8. The second coefficient calculation circuit 1391 calculates the filter coefficient CA based on the coefficient Cy calculated by the first coefficient calculation circuit 1390.

Figure 4:
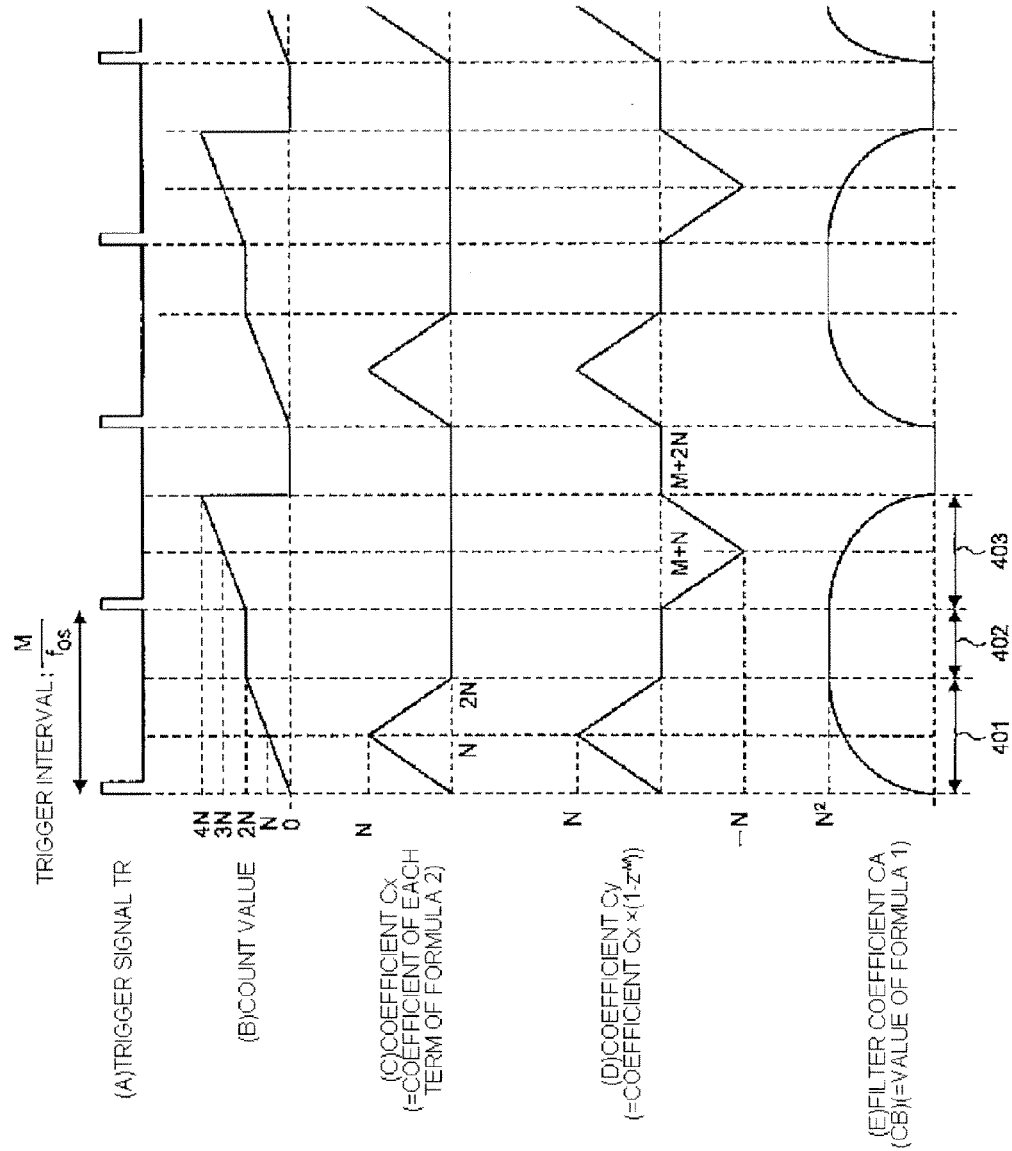
FIG. 4 is an explanatory view showing an example of a method of calculating a filter coefficient CA (CB)

FIG. 4 is an explanatory view showing an example of the method of calculating the filter coefficient CA. In the figure, with the horizontal axis as a time axis, (A) shows the trigger signal TR, (B) shows the count value of the counter unit 134, (C) shows the coefficient Cx, (D) shows the coefficient Cy, and (E) shows the filter coefficient CA.

First, when the trigger signal TR is output, the counter unit 134 starts the count operation from an initial value (=0). In a period 401 until the count value becomes 2N from 0, the coefficient calculation unit 139_A operates as follows. First, in a period until the count value becomes N (N cycles), the first coefficient calculation circuit 1390 calculates the coefficient Cx in synchronization with the clock signal so that the value of the coefficient Cx increases in proportion to the count value, and sequentially outputs the value of the coefficient Cx as the coefficient Cy. In a period until the count value becomes 2N after it becomes N, the first coefficient calculation circuit 1390 calculates the coefficient Cx in synchronization with the clock signal so that the value of the coefficient Cx decreases in accordance with the count value, and sequentially outputs the value of the coefficient Cx as the coefficient Cy. Therefore, as shown in (D) of FIG. 4, the coefficient Cy in the period 401 has an upwardly convex characteristic in which the coefficient C becomes N when the count value is N and the coefficient C becomes 0 when the count value is 2N. Moreover, the second coefficient calculation circuit 1391 calculates the filter coefficient CA by carrying out a predetermined calculation based on the coefficient Cy that is calculated one cycle before and the coefficient Cy calculated in the current cycle. Thus, as shown in (E) of FIG. 4, the filter coefficient CA in the period 401 has a characteristic in which it asymptotically approaches $N^2$ from 0. At the time point when the count value becomes 2N, the filter coefficient CA becomes $N^2$.

The counter unit 134 interrupts the count operation at the time point when the count value becomes 2N. At this time, the count value is held without being reset and the held value (=2N) is input to the first coefficient calculation circuit 1390. In a period 402 during which the counter unit 134 interrupts the count operation, the coefficient calculation unit 139_A operates as follows. The first coefficient calculation circuit 1390 calculates the coefficient Cx through the use of a fixed count value (=2N), and outputs the value of the coefficient Cx as the coefficient Cy. That is, the coefficient Cy with the same value (=0) as a value when the count value becomes 2N is output. In this case, the first coefficient calculation circuit 1390 may calculate the coefficient Cy for each cycle in synchronization with the clock signal through the use of the fixed count value (=2N) or may stop the calculation for calculating the coefficient Cy and output the value of the coefficient Cy that is held when the count value became 2N. Moreover, the second coefficient calculation circuit 1391 carries out an operation through the use of a method similar to that in the period 401. Thus, also for the value of the filter coefficient CA, the same value (=$N^2$) as a value when the count value becomes 2N is output.

After that, when the next trigger signal TR is output at a timing after the passage of M cycles, the counter unit 134 resumes the count operation and carries out the count operation until the count value becomes 4N. In a period 403 from the time when the next trigger signal is output to the time when the count value becomes 4N (until 2N cycles elapse), the coefficient calculation unit 139_A operates as follows. The first coefficient calculation circuit 1390 sequentially subtracts the value of the coefficient Cx calculated in the previous period 401 from the value of the coefficient Cx calculated in the second period 402, and thus outputs the calculated value as the coefficient Cy. That is, the first coefficient calculation circuit 1390 calculates the value of the coefficient Cy by sequentially subtracting, from the coefficient Cx (=0) calculated in the period 402, the value of the coefficient Cx at M cycles (M samples) prior to this time point. Thus, the coefficient Cy has a downwardly convex characteristic in which it becomes −N when the count value is 3N and it becomes 0 when the count value is 4N. Specifically, as shown in (D) of FIG. 4, the coefficient Cy has a characteristic in which a waveform having the opposite phase of the coefficient Cx is overlapped after M cycles. Moreover, the second coefficient calculation circuit 1391 calculates the filter coefficient CA with the same calculation method as that in the period 401 and in the period 402. Therefore, the filter coefficient CA in the period 403 has a value obtained by subtracting, from the value of the filter coefficient CA calculated in the period 402, the value of the filter coefficient CA at M cycles prior to this time point. Specifically, as shown in (E) of FIG. 4, the filter coefficient CA has a characteristic in which the value varies from $N^2$ to 0.

When the count value becomes 4N, the counter unit 134 stops the count operation and resets the count value. Then, furthermore when the next trigger signal TR is output, the count operation resumes from the count value 0. The operation thereafter is the same as the above.

As described above, the filter coefficient $C_j$ is calculated over a period (period of M+2N cycles from the period 401 to the period 403) determined by two-time applications of the trigger signal TR. During the period of the M+2N cycles, the period 401 and the period 403 are each a fixed period (period of two cycles), and the period 402 during which the counter operation is interrupted is expanded in accordance with the cycle of the trigger signal TR. That is, a period during which the filter coefficient $C_j$ determining the filter characteristic of the decimation filter 13 is calculated can be varied in accordance with the cycle of the trigger signal TR, and thus the transfer function can be made variable in accordance with the sampling frequency. Moreover, because the calculation based on the filter coefficient $C_j$ is carried out also in the period 402, the sampling period is extended and as a result the oversampling ratio will improve. That is, by extending the period 402 by increasing the cycle of the trigger signal TR, an improvement in the conversion accuracy can be also expected. It should be noted that, because a method of calculating the filter coefficient CB using the coefficient calculation unit 139_E is the same as the method of calculating the filter coefficient CA, the description thereof is omitted.

Next, a method of outputting the data of the decimation filter 13 will be described in detail.

As described above, the coefficient calculation unit 139_A calculates the filter coefficient CA for each period of M+2N cycles. The calculated filter coefficient CA is input to the multiplication unit 137_A in synchronization with the clock signal. The multiplication unit 137_A, in response to the trigger signal TR, multiplies the relevant input digital signal by the filter coefficient CA every time the one-bit digital signal of the ΔΣ-modulation data is input. The multiplication processing described above is carried out not only in the period 401 and the period 403 in FIG. 4 described above but also in the period 402 during which the counter unit 134 interrupts the count operation. The multiplication value calculated by the multiplication unit 137_A is input to the accumulation unit 138_A in synchronization with the clock signal. The accumulation unit 138_A sequentially accumulates the multiplication value during the period of the (M+2N) cycles from the period 401 to the period 403 determined by two-time applications of the trigger signal TR, and outputs the accumulation result to the output data selector 133. That is, the accumulation unit 138_A calculates the accumulated value for each (M+2N) cycles.

As described above, the coefficient calculation unit 139_A, the multiplication unit 137_A, and the accumulation unit 138_A execute the respective calculations for each M+2N cycles. That is, the first filter processing section 132_A including the coefficient calculation unit 139_A, the multiplication unit 137_A, and the accumulation unit 138_A carries out a downsampling by repeatedly executing the filtering processing for each M+2N cycles. It should be noted that, the value of each functional unit of the multiplication unit 137_A, the accumulation unit 138_A, and the like is initialized every time one calculation related to the filtering processing is completed.

However, if as the output data of the decimation filter 13, a calculation result (the accumulated result) calculated by the first filter processing section 132_A is output for each M+2N cycles, the data rate of the output of the decimation filter 13 shifts from the cycle of the trigger signal TR. For example, the data rate of the output of the decimation filter 13 becomes the output data rate of a half the cycle of the trigger signal TR. Then, in the decimation filter 13, as shown in FIG. 2, the filter processing section 132 is constituted by two systems of the first filter processing section 132_A and the second filter processing section 132_B, and these two filter processing sections are alternately operated in response to the output of the trigger signal TR, thereby keeping the same rate as that of the trigger signal TR.

Figure 5:
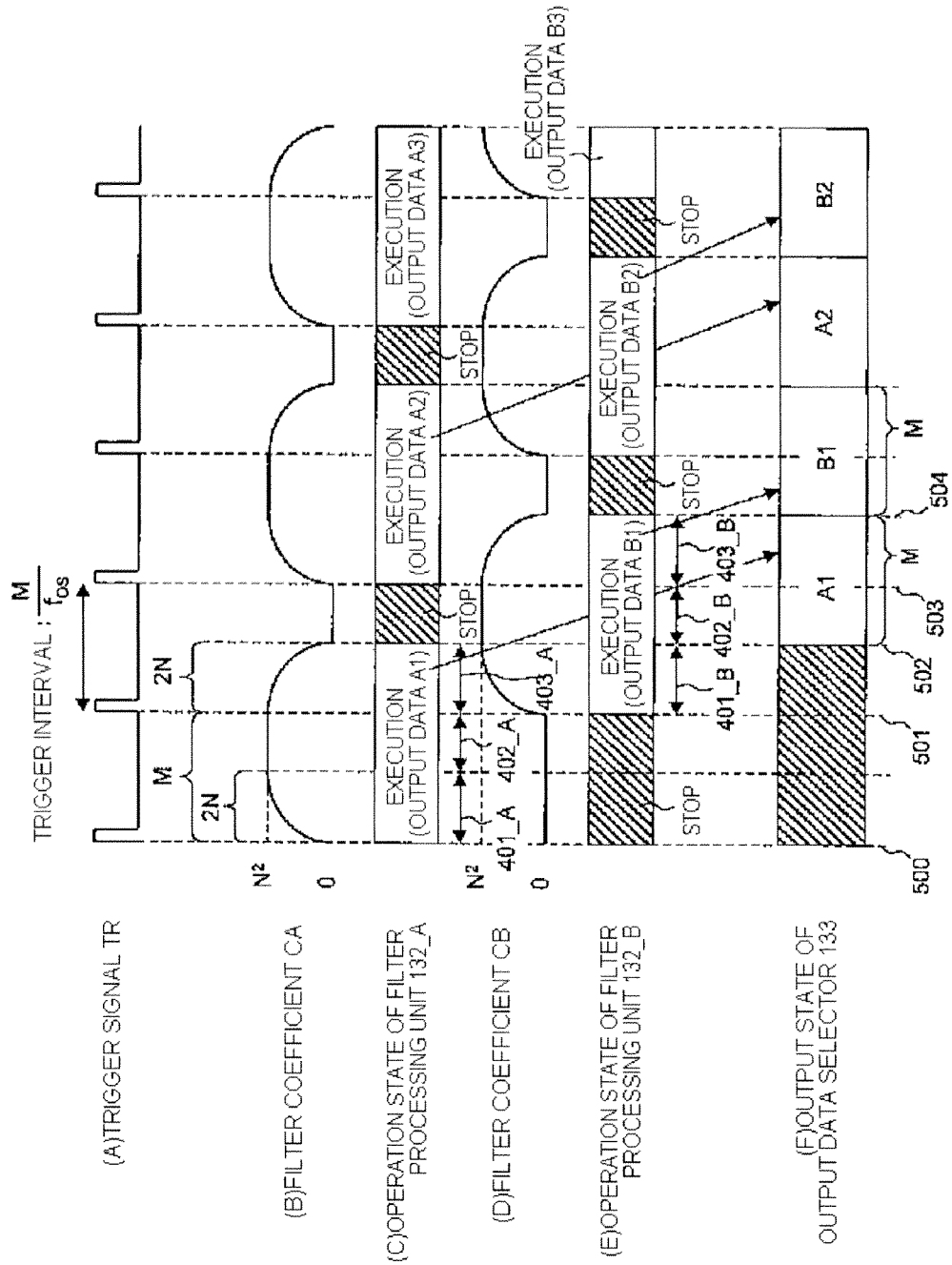
FIG. 5 is an explanatory view showing an example of the output timing of output data by the decimation filter 13.

FIG. 5 is an explanatory view showing an example of the output timing of output data by the decimation filter 13. In the figure, the horizontal axis is the time axis, (A) of the view shows the trigger signal TR, (B) shows the filter coefficient CA calculated by the coefficient calculation unit 139_A, (C) shows the operation state of the first filter processing section 132_A, (D) shows the filter coefficient CB calculated by the coefficient calculation unit 139_B, (E) shows the operation state of the second filter processing section 132_B, and (F) shows the output state of the output data selector 133. Moreover, in this figure, as the periods 401, 402, and 403 shown in FIG. 4 described above, the respective periods related to the first filter processing section 132_A are indicated as periods 401_A, 402_A, and 403_A, while the respective periods related to the second filter processing section 132_B are indicated as periods 401_B, 402_B, and 403_B.

As shown in FIG. 5, first when the first trigger signal TR is output at a timing 500, the coefficient calculation unit 139_A starts to calculate the filter coefficient CA while the multiplication unit 137_A and the accumulation unit 138_A start the above-described calculation. Then, when the second trigger signal TR is output at a timing 501 and the calculation period related to the first filtering processing by the first filter processing section 132_A ends at a timing 502, the accumulation unit 138_A outputs an accumulation result A1 of the multiplication value in a period (period of M+2N cycles) from the timing 500 to the timing 502 to the output data selector 133, and the output data selector 133 outputs the received accumulation result as the output data A1.

In contrast, when the second trigger signal TR is output at the timing 501, the coefficient calculation unit 139_B starts to calculate the filter coefficient CB while the multiplication unit 137_B and the accumulation unit 138_B start the above-described calculation. Then, when the third trigger signal TR is output at a timing 503 and the calculation period related to the first filtering processing by the second filter processing section 132_B ends at a timing 504, the accumulation unit 138_B outputs an accumulation result B1 of the multiplication values in a period (period of M+2N cycles) from the timing 501 to the timing 504 to the output data selector 133, and the output data selector 133 outputs the received accumulation result as the output data B1. Subsequently, the above-described processing is repeatedly executed every time the trigger signal TR is output.

According to the above processing, the respective filter processing sections 132 take in ΔΣ-modulation data with a period of M+2N cycles, and execute the filtering processing, and by alternately executing this filtering processing for each trigger signal TR, the accumulation result by the respective filter processing sections 132 can be alternately obtained at a timing corresponding to the cycle (M cycles) of the trigger signal TR. Because of this, as the decimation filter as a whole, the accumulation result can be output at the same data rate as that of the trigger signal TR. That is, with one application of the trigger signal TR, one A/D conversion result can be obtained. It should be noted that, in this method, even with the same ΔΣ-modulation data input to the decimation filter 13, the longer the cycle of the trigger signal TR becomes, the larger the amount of data of the accumulation result by the accumulation unit 138 becomes. Therefore, when the size of the amount of data is a problem, it is necessary to correct the amount to an appropriate value by carrying out certain data processing at a subsequent stage.

Figure 6:
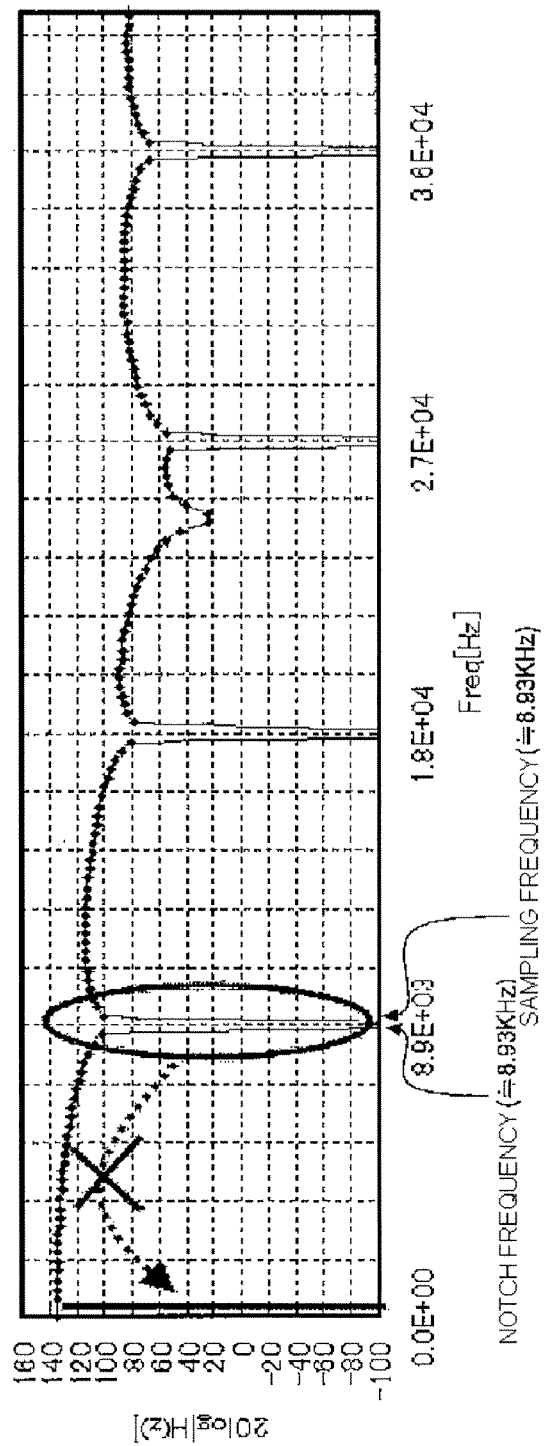
FIG. 6 is an explanatory view showing an example of the frequency characteristic of the decimation filter 13.
Figure 7:
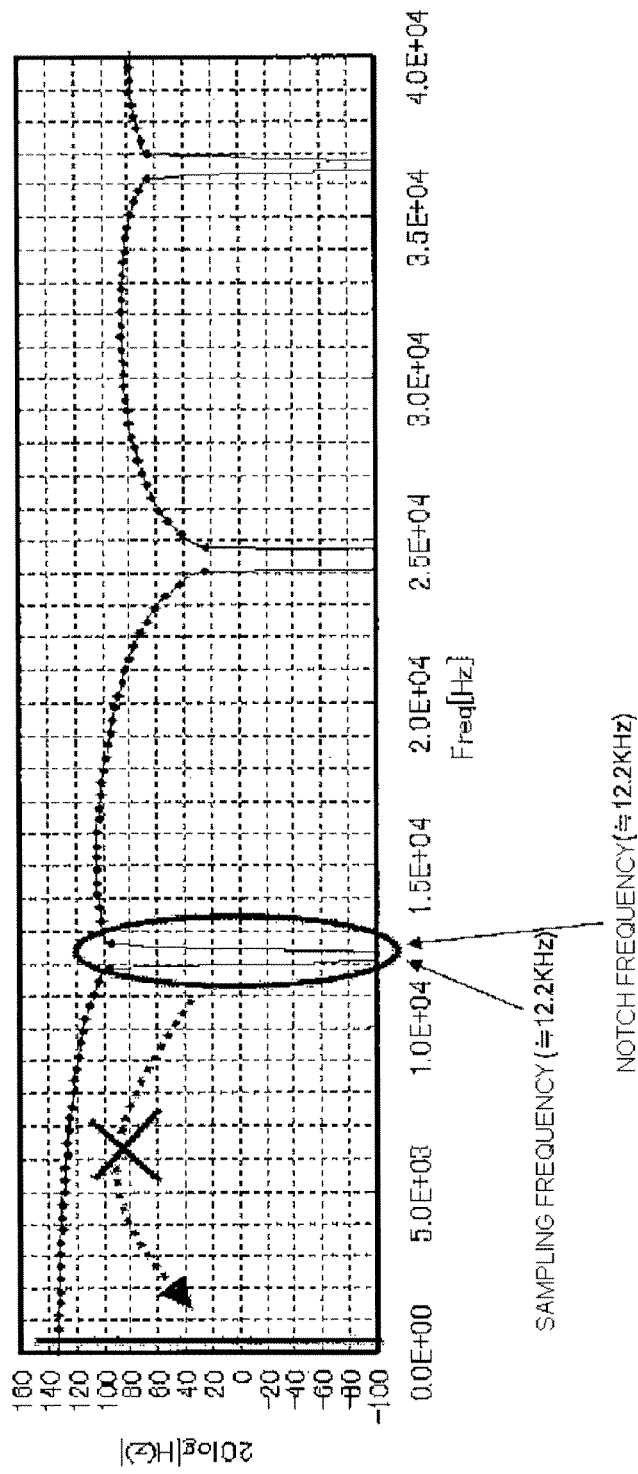
FIG. 7 is an explanatory view illustrating frequency characteristic of a decimation filter, a transfer function of which is fixed, applied to a delta sigma A/D converter.
Figure 8:
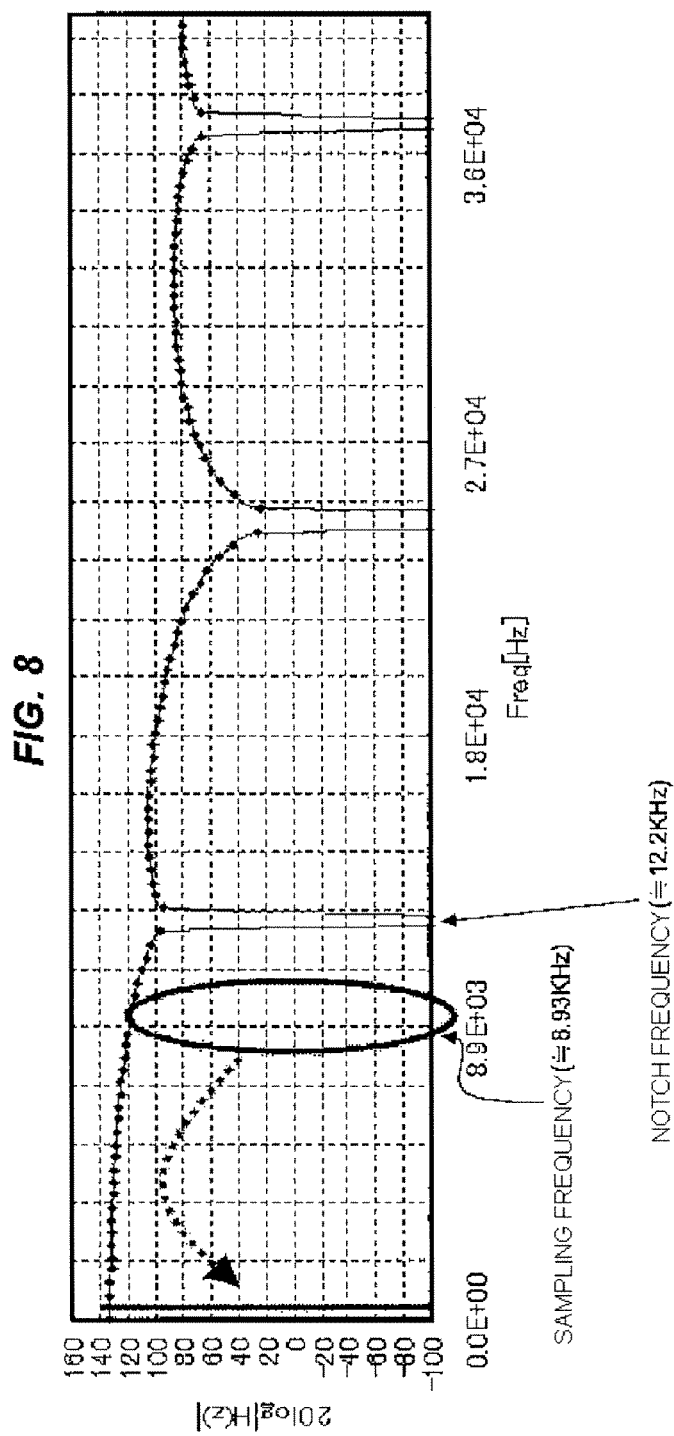
FIG. 8 is an explanatory view illustrating another frequency characteristic of the decimation filter, the transfer function of which is fixed, applied to a delta sigma A/D converter.

FIG. 6 shows an example of the frequency characteristic of the decimation filter 13. This figure shows the frequency characteristic when the trigger signal TR is output in a cycle of 1/(8.93 kHz) in order to set the sampling period of the decimation filter 13 to approximately 8.93 kHz. As shown in the figure, with the decimation filter 13, a notch frequency $f_2(\approx 8.93 \text{ kHz})$ can be set in the vicinity of the sampling frequency even when the sampling frequency is varied. According to this, for example, an aliasing noise that is generated in a frequency band (in the vicinity of 50 Hz to 60 Hz) of the analog signal VA caused by a signal of a frequency band in the vicinity of the sampling frequency can be suppressed, and thus even when a user changes the sampling frequency, a reduction in the conversion accuracy by the $\Delta\Sigma$-A/D converter 10 can be prevented.

As described above, through the use of the decimation filter 13 according to the embodiment, a user can arbitrarily set the sampling rate (sampling frequency) of a decimation filter by setting the cycle of the trigger signal TR. Moreover, by variably changing the cutoff frequency and the notch frequency of a low-pass filter in accordance with the cycle of the set trigger signal TR, the transfer function of the filter can be appropriately set. Furthermore, by providing two filter processing sections 132 and alternately operating the respective filter processing sections 132 in response to the trigger signal TR, the cycle of the trigger signal TR and the output data rate of the decimation filter 13 can be matched.

Accordingly, previously, a user was able to select only the sampling period based on limited frequency characteristic provided from a module development side, but through the use of the decimation filter 13, a user can flexibly set the sampling period and can obtain optimum frequency characteristic. Moreover, as described above, a transfer function can be made variable in accordance with a sampling frequency by realizing a decimation filter with a DSP. Through the use of the decimation filter 13, the circuit size can be reduced as compared with DSP, and thus the added cost associated with a function that makes the transfer function variable can be suppressed.

Hereinbefore, the invention made by the present inventor has been specifically described based on the embodiment, but it is needless to say that the present invention is not limited thereto, and various modifications are possible without departing from the scope and spirit of the present invention.

For example, as the method of calculating the filter coefficient CA (CB) in the period 402 (402_A, 402_B) during which the counter unit 134 interrupts the count operation, a method of calculating the fixed value ($=N^2$) is illustrated, but the method is not limited to this, and as long as the cutoff frequency can be set in a target frequency band and also a target notch frequency can be set in a target frequency band, the filter coefficient CA may not necessarily be set to a fixed value.

FIG. 4 illustrates a case where the count value by the counter unit 134 is reset at a timing immediately after the completion of the period 403 (403_A, 403_B), but the case is not limited to this, and for example, the count value may be reset at a timing when the trigger signal TR is output next.

FIG. 2 illustrates a method of switching the output destinations of the $\Delta\Sigma$-modulation data by means of the input data selector 131, but the method is not limited to this. For example, even when the $\Delta\Sigma$-modulation data is input, at the same timing, to both of the first filter processing section 132_A and the second filter processing section 132_B instead of providing the input data selector 131, the same effect as described above can be obtained.

Furthermore, in the embodiment, a case is illustrated, where the decimation filter 13 is applied to the $\Delta\Sigma$-A/D converter for an electric-power meter, but the case is not limited to this, and the present invention can be applied also to other systems. For example, the present invention can be applied also to a $\Delta\Sigma$-A/D converter for audio.

What is claimed is:

1. A semiconductor device comprising:
a decimation filter that sequentially inputs a signal sampled at a predetermined sampling rate, performs predetermined filtering processing on an input signal, and converts a resulting signal to a signal based on a required sampling rate to output the resulting signal,
wherein the decimation filter calculates, for the each input signal that is input within a predetermined period, a filter coefficient for performing predetermined filtering processing in response to a trigger signal continuously applied, sequentially multiplies the input signal by the calculated filter coefficient, and furthermore accumulates a multiplication value within the predetermined period and sequentially outputs the resulting value,
wherein the predetermined period is made variable in accordance with a time interval at which the trigger signal is applied,
wherein the decimation filter includes:
a coefficient calculation unit which, in response to the trigger signal, sequentially calculates the filter coefficient every time the input signal is input; and
an arithmetic unit which, every time the input signal is input, multiplies the input signal by the filter coefficient calculated by the coefficient calculation unit, and accumulates this multiplication value to output the resulting value,
wherein the coefficient calculation unit, in a first period after the trigger signal is applied, sequentially calculates the filter coefficient so that a value increases in accordance with a number of times when the input signal is input after the trigger signal is applied, while in a second period after the trigger signal is applied, the coefficient calculation unit sequentially calculates the filter coefficient so that the value decreases in accordance with a number of times when the input signal is input after the trigger signal is applied,
wherein the arithmetic unit sequentially outputs a value obtained by accumulating the multiplication value from the time when the first period is started to the time when the second period ends, and
wherein the coefficient calculation unit sets the first period and the second period that are each a period that is shorter than a cycle corresponding to the required sampling rate and is a predetermined period.

2. The semiconductor device according to claim 1, wherein the coefficient calculation unit, in a third period until the next trigger signal is applied after the first period elapses, calculates the filter coefficient to serve as a fixed value.

3. The semiconductor device according to claim 2, wherein the coefficient calculation unit, in the second period, calculates the filter coefficient by sequentially subtracting a value of the filter coefficient calculated in the previous first period from a value of the filter coefficient calculated in the third period, every time the input signal is input.

4. The semiconductor device according to claim 2, wherein the decimation filter further includes a counter unit which, in response to the trigger signal, counts a clock signal that is generated in response to a timing at which the input signal is input,
wherein the counter unit starts a count operation for counting the clock signal when the trigger signal is applied, interrupts the count operation when a count value by the count operation coincides with a first value, resumes the count operation when the next trigger signal is input, and stops the count operation when the count value coincides with a second value larger than the first value, and wherein the coefficient calculation unit sets a period from the time when the trigger signal is applied until the time when the count value coincides with the first value, to the first period, sets a period in which the count operation is interrupted to the third period, sets a period from the time when the next trigger signal is applied until the time the count value coincides with the second value, to the second period, and calculates the filter coefficient, with the count value as the number of times of input.

5. The semiconductor device according to claim 1, wherein the decimation filter includes two sets of filter processing sections, each being one set of the coefficient calculation unit and the arithmetic unit, and further includes a selection unit that inputs signals output from the calculation units in the filter processing section, respectively, and selects either one of the signals and outputs this signal as an output signal of the decimation filter, wherein the respective filter processing sections complementarily operate in response to application of the trigger signal, and wherein the selection unit, at a time interval based on the cycle in which the trigger signal is applied, alternately selects the signals output from the respective arithmetic units to output the signal.

6. The semiconductor device according to claim 1, wherein the predetermined period is adjusted by the decimation filter in accordance with the time interval at which the trigger signal is applied, and wherein a transfer function of the decimation filter is adjusted by the decimation filter.

7. The semiconductor device according to claim 1, wherein by applying the trigger signal to the decimation filter with a cycle based on the required sampling rate, a period for calculating the filter coefficient and a period for accumulating the multiplication value vary in accordance with the required sampling rate, and wherein a transfer function of the decimation filter is varied in response to applications of the trigger signal.

8. The semiconductor device according to claim 1, wherein a filter characteristic of the decimation filter is varied by the decimation filter in accordance with the sampling rate of the decimation filter, and wherein in the third period, the calculation based on the filter coefficient is carried out and sampling period is extended by the decimation filter.

9. The semiconductor device according to claim 1, wherein the coefficient calculation unit, in the second period, calculates the filter coefficient by sequentially subtracting a value of the filter coefficient calculated in the previous first period from a value of the filter coefficient calculated in a third period, every time the input signal is input.

10. A semiconductor device comprising:

an analog-to-digital converter which, based on a delta-sigma modulation scheme, converts an input analog signal to a digital signal based on a required sampling rate to output this digital signal;

a central processing unit that performs data processing based on the digital signal converted by the analog-to-digital converter; and a timer unit that outputs a trigger signal in a cycle corresponding to the required sampling rate, wherein the analog-to-digital converter includes:

a delta-sigma modulator that over-samples the analog signal at a predetermined sampling rate and carries out a delta sigma modulation; and a decimation filter that sequentially inputs the signal delta-sigma modulated by the delta-sigma modulator and performs predetermined filtering processing on an input signal, and furthermore converts the resulting signal to a digital signal based on a required sampling rate to output the digital signal, wherein the decimation filter calculates, for the each input signal that is input within a predetermined period, a filter coefficient for performing predetermined filtering processing in response to a trigger signal continuously output from the timer unit, and furthermore sequentially multiplies the input signal by the calculated filter coefficient, accumulates multiplication value within the predetermined period, and sequentially outputs the resulting value, wherein the predetermined period is made variable in accordance with a time interval in which the trigger signal is output, wherein the decimation filter includes:

a coefficient calculation unit which, in response to the trigger signal, sequentially calculates the filter coefficient every time the input signal is input; and an arithmetic unit which, every time the input signal is input, multiplies the input signal by the filter coefficient calculated by the coefficient calculation unit, and accumulates this multiplication value to output the resulting value, wherein the coefficient calculation unit, in a first period after the trigger signal is applied, sequentially calculates the filter coefficient so that a value increases in accordance with a number of times when the input signal is input after the trigger signal is applied, while in a second period after the trigger signal is applied, the coefficient calculation unit sequentially calculates the filter coefficient so that the value decreases in accordance with a number of times when the input signal is input after the trigger signal is applied, wherein the arithmetic unit sequentially outputs a value obtained by accumulating the multiplication from the time when the first period is started to the time when the second period ends, and wherein the first period and the second period are each a period that is shorter than a cycle corresponding to the required sampling rate and is a predetermined period.

11. The semiconductor device according to claim 10, wherein the coefficient calculation unit, in a third period until the next trigger signal is output after the first period elapses, calculates the filter coefficient to serve as a fixed value.

12. The semiconductor device according to claim 11, wherein the coefficient calculation unit, in the second period, calculates the filter coefficient by sequentially subtracting a value of the filter coefficient calculated in the previous first period from a value of the filter coefficient calculated in the third period, every time the input signal is input.

13. The semiconductor device according to claim 11, wherein the decimation filter further includes a counter unit which, in response to the trigger signal, counts a clock signal that is generated in response to a timing at which the input signal is input, wherein the counter unit starts a count operation for counting the clock signal when the trigger signal is output, interrupts the count operation when a count value by the count operation coincides with a first value, and resumes the count operation when the next trigger signal is input, and stops the count operation when the count value coincides with a second value larger than the first value, and wherein the coefficient calculation unit sets a period from the time when the trigger signal is output until the time when the count value coincides with the first value, to the first period, sets a period during which the count operation is interrupted to a third period, and sets a period from the time when the next trigger signal is output until the time when the count value coincides with the second value, to the second period, and calculates the filter coefficient, with the count value as the number of times of input.

14. The semiconductor device according to claim 10, wherein the decimation filter includes two sets of filter processing sections, each being one set of the coefficient calculation unit and the arithmetic unit, and a selection unit that inputs signals output from the calculation units in the filter processing section, respectively, and selects either one of the signals as an output signal of the decimation filter to output this signal, wherein the respective filter processing sections complementarily operate in response to output of the trigger signal, and wherein the selection unit, at a time interval based on the cycle in which the trigger signal is output, alternately selects the signals output from the respective arithmetic units to output the signal.

15. The semiconductor device according to claim 10, wherein the predetermined period is made variable by the decimation filter in accordance with the time interval at which the trigger signal is applied.

16. The semiconductor device according to claim 10, wherein the coefficient calculation unit sets the first period and the second period that are each a period that is shorter than a cycle corresponding to the required sampling rate and is a predetermined period.

17. A method of a semiconductor device, the method comprising:

sequentially inputting, by a decimation filter, a signal sampled at a predetermined sampling rate;

performing predetermined filtering processing on an input signal;

converting a resulting signal to a signal based on a required sampling rate to output the resulting signal; and calculating, by the decimation filter, for the each input signal that is input within a predetermined period, a filter coefficient for performing predetermined filtering processing in response to a trigger signal continuously applied, sequentially multiplying the input signal by the calculated filter coefficient, and furthermore accumulating a multiplication value within the predetermined period and sequentially outputs the resulting value, wherein the predetermined period is made variable by the decimation filter in accordance with a time interval at which the trigger signal is applied to the decimation filter, wherein the decimation filter includes a coefficient calculation unit, and an arithmetic unit, in response to the trigger signal, sequentially calculating, by the coefficient calculation unit, the filter coefficient every time the input signal is input; and every time the input signal is input, multiplying, by the arithmetic unit, the input signal by the filter coefficient calculated by the coefficient calculation unit, and accumulating this multiplication value to output the resulting value, wherein the coefficient calculation unit, in a first period after the trigger signal is applied, sequentially calculates the filter coefficient so that a value increases in accordance with a number of times when the input signal is input after the trigger signal is applied, while in a second period after the trigger signal is applied, the coefficient calculation unit sequentially calculates the filter coefficient so that the value decreases in accordance with a number of times when the input signal is input after the trigger signal is applied, wherein the arithmetic unit sequentially outputs a value obtained by accumulating the multiplication value from the time when the first period is started to the time when the second period ends, and wherein the coefficient calculation unit sets the first period and the second period that are each a period that is shorter than a cycle corresponding to the required sampling rate and is a predetermined period.

* * * * *